United States Patent [19]
Tange

[11] Patent Number: 6,005,185
[45] Date of Patent: Dec. 21, 1999

[54] COOLANT SEALING STRUCTURE FOR A SOLAR CELL

[75] Inventor: Kyoichi Tange, Mishima, Japan

[73] Assignee: Toyota Jidosha Kabushiki Kaisha, Aichen-ken, Japan

[21] Appl. No.: 08/994,646

[22] Filed: Dec. 19, 1997

[30] Foreign Application Priority Data

Dec. 25, 1996 [JP] Japan ..................................... 8-344786

[51] Int. Cl.⁶ ...................... H01L 31/052; H01L 31/0236
[52] U.S. Cl. .......................... 136/289; 136/246; 136/248; 136/256; 126/634; 126/651; 126/652; 126/666; 126/668; 126/669; 126/667; 126/670; 126/671; 126/672; 126/673; 250/573
[58] Field of Search ..................... 136/246, 248, 136/256, 259; 126/634, 651, 652, 666, 668, 669, 667, 670, 671, 672, 673; 250/573

[56] References Cited

U.S. PATENT DOCUMENTS

| | | | |
|---|---|---|---|
| 3,397,278 | 8/1968 | Pomerantz | 257/650 |
| 3,989,541 | 11/1976 | Brandhorst, Jr. . | |
| 4,045,246 | 8/1977 | Mlavsky et al. . | |
| 4,052,228 | 10/1977 | Russell | 136/246 |
| 4,052,246 | 10/1977 | Mlavsky et al. | 136/246 |
| 4,119,863 | 10/1978 | Kelly . | |
| 4,135,537 | 1/1979 | Bleiden et al. | 136/247 |
| 4,143,233 | 3/1979 | Kapany et al. | 136/259 |
| 4,143,234 | 3/1979 | Johnson et al. . | |
| 4,144,095 | 3/1979 | Mlavsky . | |
| 4,146,407 | 3/1979 | Litsenko et al. . | |
| 4,191,594 | 3/1980 | Stark et al. | 136/246 |
| 4,342,231 | 8/1982 | Yamamoto et al. | 73/721 |
| 4,389,533 | 6/1983 | Ames | 136/248 |
| 4,982,723 | 1/1991 | Mori | 126/440 |
| 5,024,097 | 6/1991 | Graeger et al. | 73/727 |
| 5,080,725 | 1/1992 | Green et al. | 136/256 |
| 5,211,058 | 5/1993 | Fukiura et al. | 73/724 |
| 5,817,396 | 10/1998 | Perlo et al. | 428/141 |

FOREIGN PATENT DOCUMENTS

| | | |
|---|---|---|
| 0 033 683 | 8/1981 | European Pat. Off. . |
| 5-83881 | 4/1993 | Japan . |
| 5-332636 | 12/1993 | Japan . |

OTHER PUBLICATIONS

Chappell et al., "Characteristics of a Water Absorber in Front of a Silicon Solar Cell," Applied Physics Letters, 28(8), Apr. 1976.
Terry I. Chappell et al., "Characteristics Of A Wafer Absorber In Front Of A Silicon Solar Cell", Applied Physics Letters, vol. 28, No. 8, Apr. 15, 1976 (pp. 422–423).
European Search Report dated Nov. 2, 1998.
Communication dated Nov. 18, 1998.

*Primary Examiner*—Alan Diamond
*Attorney, Agent, or Firm*—Finnegan, Henderson, Farabow, Garrett & Dunner, L.L.P.

[57] ABSTRACT

A coolant sealing structure for a solar cell of which the sealing property is maintained with high reliability in use for a long period. A solar cell has its light receiving surface and a reinforced portion formed around the fringe portion of the light receiving surface. The plate member is joined with the top of the reinforced portion by means of an anode joint process. A transparent member is joined with the plate member to form a coolant passage. This structure allows the solar cell to be directly cooled with the coolant flowing through the coolant passage. Since the solar cell is joined with the plate member, separation does not occur at the joined portion under repeated temperature changes. The coolant sealing structure can be used with high reliability for a long period.

5 Claims, 3 Drawing Sheets

COOLANT SEALING STRUCTURE FOR A SOLAR CELL

BACKGROUND OF THE INVENTION

1. Field of the Invention

The present invention relates to a solar battery, and more particularly to a solar battery cooling structure.

2. Description of the Related Art

Generally, a solar cell tends to have decreased power generation capability as its temperature rises. For example, when the temperature of a solar cell rises up to 100° C., its power generation capability decreases by about 60% compared to that at 25° C. Hence, various solar cell cooling techniques have been conventionally proposed to suppress a fall in power generation and to improve the durability. Such a solar cell cooling technique is disclosed in Japanese patent laid-open publication Hei 5-83881. This publication teaches the technique of immersing a solar cell element into water according to a cooling jacket system. In this example, a solar module is formed by arranging solar cells and then covering the intermediate product with a waterproof resin. Hence, it is considered that the solar cells are indirectly cooled via the resin.

However, in order to reduce energy recovering years or energy payback term (years in which the energy used for production of a solar module can be recovered as generated power) and to reduce the cost of building a solar-cell built-in power generating system, much attention has recently been focused on the light-gathering-type solar module that gathers the sunlight using a condenser, thus increasing the incident light amount on a solar cell and reducing the use area for expensive solar cells. In such a light-gathering solar module unit, since the temperature of the solar cell rises significantly with an increase of the light condensing degree, it is difficult to obtain a sufficient cooling effect in the conventional cooling method. In order to cool the solar cell effectively and efficiently, the solar cell may be directly cooled with a coolant. A technique of directly cooling a solar cell is shown in FIG. 5. Referring to FIG. 5, the solar cell 10 is formed on the substrate 100. The generated power is taken out of the electrodes 12 formed on the rear surface of the solar cell 10 via the bus lines 102. Bank-like reinforced portions 14 are formed around the fringe of the light receiving surface of the solar cell 10. The sealing agent 104 such as an epoxy resin seals surfaces ranging from the reinforced portion 14 to the substrate 100 and is filled in the gap between the solar cell 10 and the substrate 100. Even when the solar cell 10 is directly cooled with a coolant such as water, this sealing agent prevents the coolant from flowing onto the electrode 12. As a result, the electrode can be prevented from being corroded. However, when the solar cell is used for a long period of time, the solar cell 10 experiences repetitive changes in temperature. The difference in thermal expansion coefficient between silicon, or a material forming the solar cell 10, and the sealing agent 104 causes the sealing agent 104 to come away from the solar cell 10. It is considered that this coming away occurs when the solar cell is used for 2 to 6 years. For that reason, there is the problem in that the coolant is leaked from the interface between the solar cell 10 and the sealing agent 104 to the electrode 12, thus corroding the electrode 12.

SUMMARY OF THE INVENTION

The objective of the present invention is to solve the above-mentioned problems. Moreover, the objective of the invention is to provide a coolant sealing structure for a solar cell with high reliability of which the sealing property is maintained in use for a long period. According to the present invention, a coolant sealing structure for a solar cell comprising a plate member bonded with the fringe portion of the solar cell by means of an anode bonding process, the plate member forming a coolant passage. According to the present invention, the coolant sealing structure further comprises a bank-like reinforced portion disposed around the fringe portion of the solar cell. The bank-like reinforced portion is joined with the plate member by means of an anode joint process. According to the coolant sealing structure of the present invention, the bank-like reinforced portion is disposed at least on the light receiving surface or the rear surface of the solar cell. According to the coolant sealing structure of the present invention, the coolant passage comprises a transparent member joined on the plate member so as to cover the solar cell. According to the present invention, the coolant sealing structure further comprises a water reservoir which is adjacent to said coolant passage and is integrally formed with said coolant passage.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Figure 1:
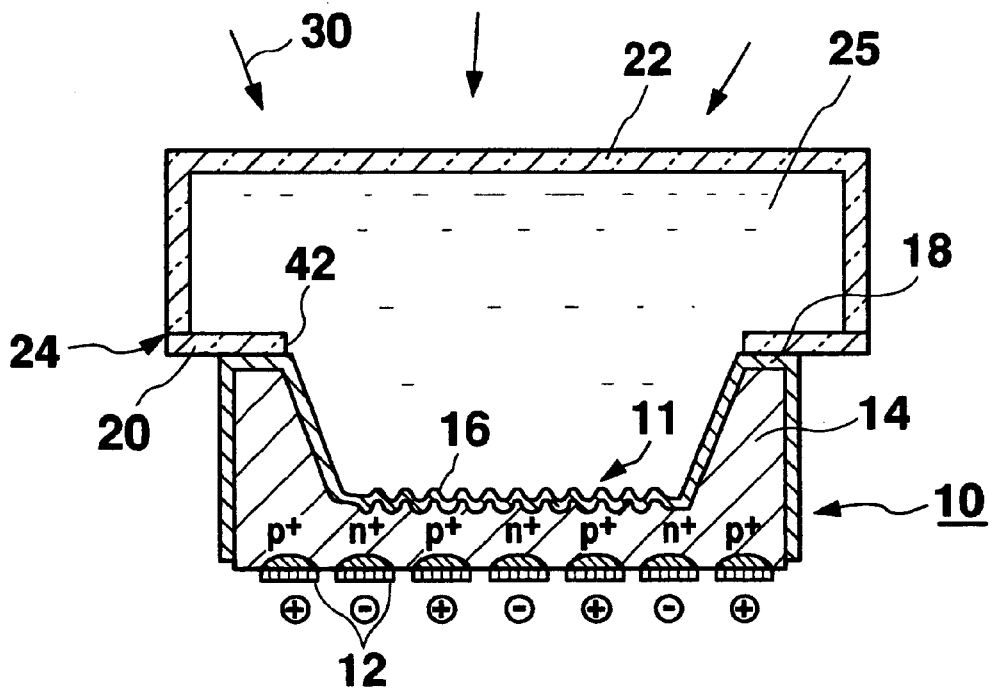
FIG. 1 is a cross-sectional view showing a coolant sealing structure for a solar cell according to an embodiment of the present invention.

Next, an embodiment of the present invention will be described below with reference to the attached drawings. FIG. 1 is a cross-sectional view showing the coolant sealing structure for a solar cell according to an embodiment of the present invention. Referring to FIG. 1, the solar cell 10 is formed of a p-type or n-type silicon wafer with a thickness of 300 to 700 $\mu$m. Particularly, the portion forming the light receiving surface 11 is thinned.

The thinning is done to shorten the movable distance of carriers created by the sunlight falling onto the light receiving surface 11 to as long as 50 to 100 $\mu$m, so that an increased carrier life time and reduced resistance can be realized. In this case, when the portion on which the light receiving surface 11 is formed is thinned, the incident light cannot be sufficiently trapped, so that the photoelectric conversion efficiency decreases. For that reason, a pyramidal or inverted-pyramidal texture 16 is formed on the light receiving surface 11 to trap light sufficiently. Moreover, in the solar cell 10, the portion 11 on which the light receiving surface 11 is formed thin, the bank portion is left around the light receiving surface 11 and acts as the reinforced portion 14 to improve the mechanical strength of the solar cell 10.

In order to prolong the carrier life time, the impurity concentration of the silicon wafer forming the solar cell 10 is set to a low value, for example, several 10 to 200 Ωcm. N-type diffusion layers and p-type diffusion layers are alternately arranged on the rear surface of the light receiving surface 11 to form pn junctions. Positive electrodes and negative electrodes are respectively formed on the pn junctions. A protective film 18 made of a silicon oxide layer or a nitride film is formed on the surface of the solar cell 10. The top of the reinforced portion 14 of the solar cell 10 has a mirror surface with high smoothness.

A plate member 20 of a glass material is disposed on the planished top surface of the reinforced portion 14. This plate member 20 is bonded to the top of the reinforced portion 14 using an anode bonding process. A rectangular opening 42 is formed corresponding to the light receiving surface 11 of the solar cell.

When Pyrex (trademark) glass is used as the plate member 20, the anode bonding is carried out by increasing the temperature of the solar cell and the plate member 20 to 350 to 450° C. and then applying a voltage of 300 to 1000V. Under such conditions, the protective film 18 of an increased thickness requires a process of bonding at a higher temperature and under a higher voltage. When the protective film 18 has a thickness of 3000 or less angstroms, the bonding operation can be performed under the above-mentioned conditions. Upon the anode bonding operation, Na+ ions are attracted in the negative electric field at a lower temperature than the melting point of a glass or a silicon wafer while moving in a glass, thus finally reaching the interface between the plate member 20 and the top of the reinforced portion 14. A space charge layer is formed in the interface. Then, silicon atoms existing in the protective film 18 react with Na+ ions moving in the glass. This chemical bonding allows a strong adhesive strength to be obtained.

A transparent member 22 made of a transparent resin such as acrylic resin or glass covers the plate member 20. The transparent member 22 is adhered or welded at the contact portion 24 to form a coolant passage 25. Heat is carried away from the solar cell by circulating a coolant through the coolant passage 25. In this case, the coolant is in direct contact with the solar cell 10 via the hole 42, thus providing a direct cooling effect. The contact portion 24 can be omitted by integrally forming the plate member 20 with the transparent member 22.

Figure 2:
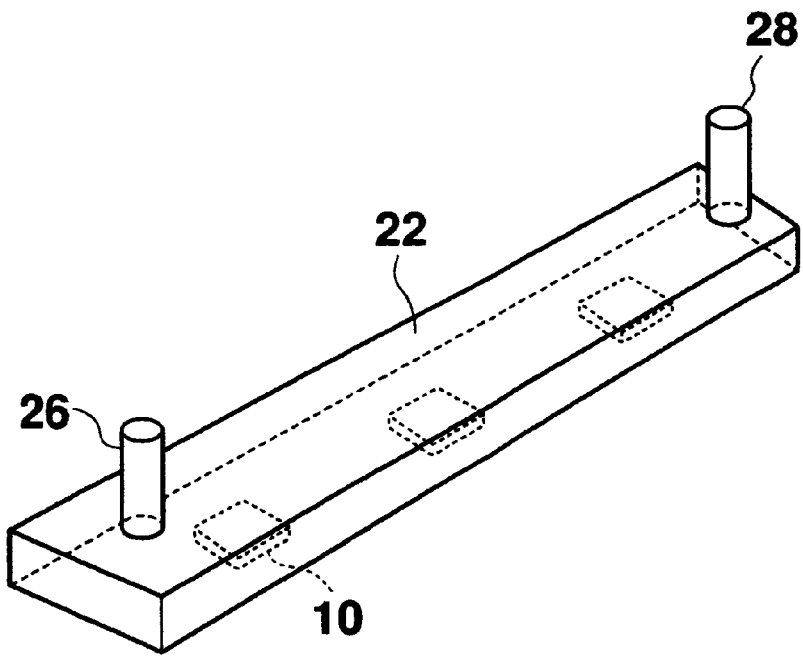
FIG. 2 is a perspective view showing the coolant sealing structure for a solar cell in FIG. 1.

FIG. 2 is a perspective view showing a coolant sealing structure for a solar cell according to the present embodiment. Referring to FIG. 2, the coolant circulates in the transparent member 22 via the coolant conduits 26 and 28 and directly cools the solar cell 10.

In the embodiment shown in FIGS. 1 and 2, the reinforced portion 14 is securely fixed with the plate member 20 through an anode bonding operation. Since the difference in thermal expansion coefficient between the glass and the silicon is small, the reinforced portion 14 does not come away from the plate member 20 under repetitive temperature changes. According to the present embodiment, a condenser (not shown) is basically used to gather the sunlight 30. Even when intensive collective light beams gathered by the condenser are irradiated, the bonded portion where the top of the reinforced portion 14 and the plate member 20 are bonded does not degrade substantially. For example, it was confirmed that irradiating continuously light of 10 W/cm$^2$ (corresponding to light condensed 100 times) for 10000 hours does not totally affect the hermetic property of the bonded portion.

Figure 3:
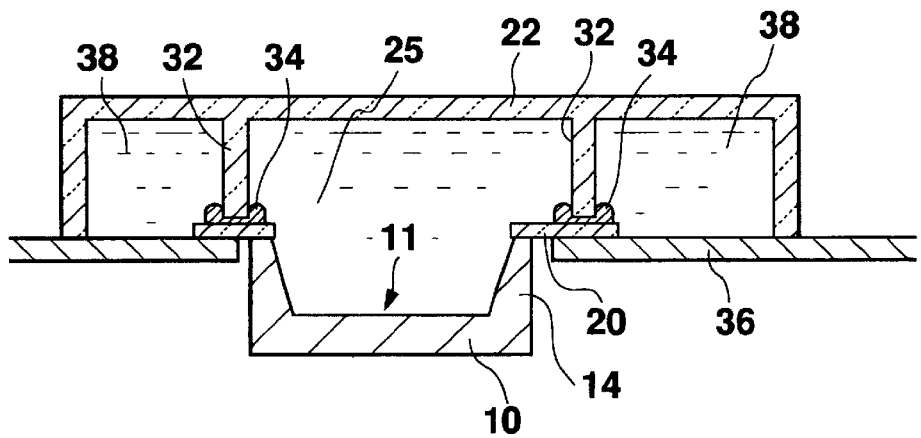
FIG. 3 is a cross-sectional view showing a coolant sealing structure for a solar cell according to another embodiment of the present invention.

FIG. 3 shows a coolant sealing structure for a solar cell according to another embodiment of the present invention. Referring to FIG. 3, the transparent member 22 has walls 32 which are in contact with the plate member 20. The gap is sealed with a rubber packing 34. A coolant passage 25 is formed of the solar cell 10, the plate member 20, and the wall 32 of the transparent member 22.

In the present embodiment, the transparent member 22 has the structure shown in FIG. 3. The lower plate portion 36 extends to the plate member 20. The plate member 20 is adhered or welded with the lower plate portion 36. In this structure, coolant rooms 38 are disposed on both sides of the coolant passage 25. The coolant rooms 38 are always filled with a coolant. Even if the coolant goes away from the coolant passage 25, cooling of the bonded surfaces between the reinforced portion 14 and the plate member 20 can be maintained. This feature allows the bonded surface to be always cooled, so that the temperature change is small at the bonded surfaces. The reliability of the hermetic characteristic of the bonded portion is further improved.

Figure 4:
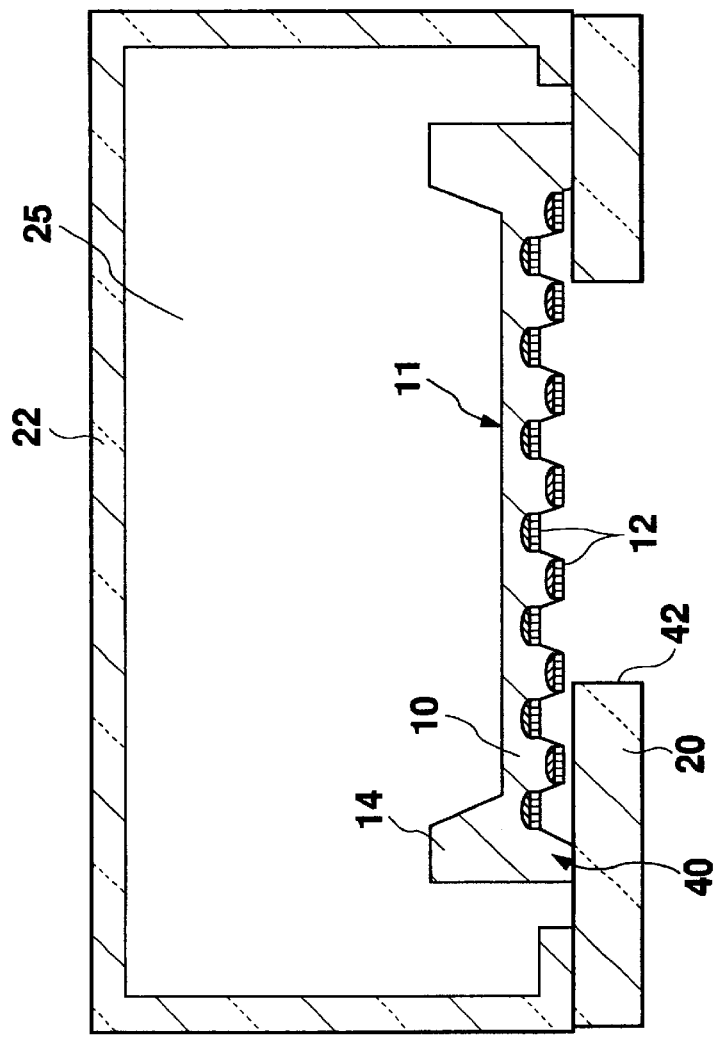
FIG. 4 is a cross-sectional view showing a coolant sealing structure for a solar cell according to further another embodiment of the present invention.
Figure 5:
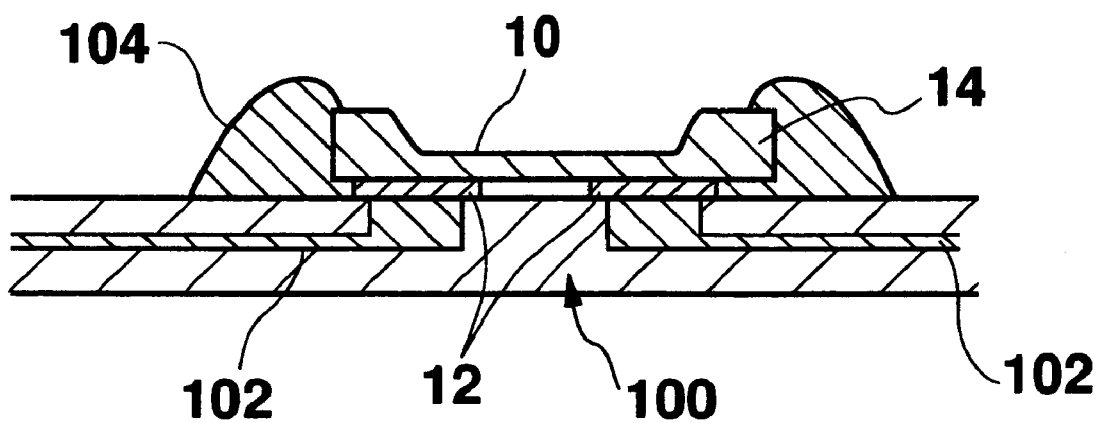
FIG. 5 is a diagram showing the structure of directly cooling the light receiving surface of a solar cell with a coolant.

FIG. 4 is a coolant sealing structure for a solar cell according to yet another embodiment of the present invention. In the solar cell 10 shown in FIG. 4, the reinforced portion 14 is formed on the periphery of the light receiving surface 11 while the other reinforced portion 40 is formed on the back surface. The reinforced portion 40 of the solar cell 10 is bonded to the plate member 20 on the back surface side by an anode bonding operation. When the reinforced portion 40 on the rear surface side can sufficiently secure the strength of the solar cell 10, the reinforced portion 14 on the front surface side can be omitted.

In the embodiment shown in FIG. 1, the rectangular opening 42 corresponding to the light receiving surface 11 of the solar cell 10 is formed in the plate member 20. The top of the reinforced portion 14 must be bonded with the fringe of the opening 42. However, it is difficult to form the rectangular opening 42 in the plate member 20 through machining. In the present embodiment, the opening 42 is merely formed to extract leads extending from the electrode 12 formed on the rear surface of the solar cell 10. The opening 42 may be, for example, a round hole which can be easily machined. For that reason, the present embodiment allows the solar cell to be easily fabricated. For example, such a hole can be sufficiently formed through ultrasonic processing or mechanical machining.

In the present embodiment, the coolant passage 25 is formed by bonding the transparent member 22 with the plate member 20.

As described above, according to the present invention, since the solar cell is anode-bonded with the plate member, the adhesive strength as well as sealing effect can be improved. The hermetic property of the bonded surface can be further improved in reliability by forming coolant rooms on both the sides of the coolant passage. Moreover, in the structure where the reinforced portion additionally formed on the rear surface of a solar cell is anode-bonded with the plate member, the opening can be arbitrarily shaped in the plate member so that the workability can be improved.

What is claimed is:

1. A coolant sealing structure for a solar cell comprising a plate member bonded with the fringe portion of the solar cell by anode bonding, said plate member forming a coolant passage.

2. The coolant sealing structure defined in claim 1, further comprising:

a banked reinforced portion disposed around the fringe portion of said solar cell;

wherein said banked reinforced portion is joined with said plate member by anode bonding.

3. The coolant sealing structure defined in claim 2, wherein said banked reinforced portion is disposed at least on the light receiving surface or the rear surface of said solar cell.

4. The coolant sealing structure defined in claim 1, wherein said coolant passage comprises a transparent member joined on said plate member so as to cover said solar cell.

5. The coolant sealing structure defined in claim 4, further comprising:

a water reservoir which is adjacent to said coolant passage and is integrally formed with said coolant passage.

* * * * *